(12) United States Patent
Kim et al.

(10) Patent No.: US 9,886,992 B2
(45) Date of Patent: Feb. 6, 2018

(54) MEMORY DEVICE AND SYSTEM INCLUDING THE SAME

(71) Applicant: SK hynix Inc., Icheon-si, Gyeonggi-do (KR)

(72) Inventors: Chang Hyun Kim, Seoul (KR); Min Chang Kim, Seoul (KR); Do Yun Lee, Yongin-si (KR); Yong Woo Lee, Seongnam-si (KR); Jae Jin Lee, Gwangju-si (KR); Hun Sam Jung, Icheon-si (KR); Hoe Kwon Jung, Icheon-si (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 15/486,044

(22) Filed: Apr. 12, 2017

(65) Prior Publication Data

US 2017/0221545 A1   Aug. 3, 2017

Related U.S. Application Data

(62) Division of application No. 15/058,332, filed on Mar. 2, 2016, now Pat. No. 9,653,140.

(30) Foreign Application Priority Data

Oct. 16, 2015   (KR) .................... 10 2015 0144665

(51) Int. Cl.
*G11C 11/406*   (2006.01)
*G11C 11/4094*   (2006.01)
*G11C 11/408*   (2006.01)
*G11C 11/4096*   (2006.01)

(52) U.S. Cl.
CPC ..... *G11C 11/40611* (2013.01); *G11C 11/4087* (2013.01); *G11C 11/4094* (2013.01); *G11C 11/4096* (2013.01); *G11C 11/40615* (2013.01)

(58) Field of Classification Search
CPC ...................................................... G11C 11/406
USPC ............................................ 365/222; 711/106
See application file for complete search history.

(56) References Cited

U.S. PATENT DOCUMENTS

| | | | | |
|---|---|---|---|---|
| 5,928,365 A | * | 7/1999 | Yoshida | ................. G06F 1/3225 365/222 |
| 6,879,536 B2 | * | 4/2005 | Lee | ....................... G11C 7/1051 365/222 |
| 7,821,861 B2 | | 10/2010 | Lin et al. | |
| 8,588,017 B2 | | 11/2013 | Park et al. | |
| 9,355,703 B2 | | 5/2016 | Lee et al. | |
| 2003/0217246 A1 | * | 11/2003 | Kubota | ................. G06F 1/3203 711/170 |
| 2004/0027900 A1 | | 2/2004 | Lee | |

(Continued)

*Primary Examiner* — Son Mai
(74) *Attorney, Agent, or Firm* — William Park & Associates LTD.

(57) ABSTRACT

A memory device may include: an active controller configured to output a row active signal in response to a refresh control signal and a row enable signal when an active signal is activated; a refresh controller configured to generate and store a flag bit for controlling a refresh operation in response to a refresh signal, a precharge signal, and a precharge stop signal, and output the row enable signal corresponding to the stored flag bit to the active controller; and a cell array circuit configured to perform a refresh operation in memory cell array areas in response to the row active signal.

9 Claims, 6 Drawing Sheets

(56) References Cited

U.S. PATENT DOCUMENTS

2007/0180187 A1* 8/2007 Olson ............... G06F 12/10
  711/106
2014/0241093 A1  8/2014 Lee et al.
2014/0297986 A1  10/2014 Lee

* cited by examiner

MEMORY DEVICE AND SYSTEM INCLUDING THE SAME

CROSS-REFERENCES TO RELATED APPLICATION

The present application is a divisional application of U.S. application Ser. No. 15/058,332, filed on Mar. 2, 2016, which is incorporated herein by reference in its entirety.

BACKGROUND

1. Technical Field

Various embodiments relate to a memory device and a system including the same, and more particularly, to a technology capable of reducing a refresh current of a memory device.

2. Related Art

Recently, mobile electronic devices including smart phones require large-capacity DRAM. In general, data stored in a memory cell of a semiconductor memory device such as DRAM may be changed by a leakage current. Thus, a refresh operation is required to periodically recharge the memory cell having the data stored therein.

That is, a memory cell of a dynamic semiconductor memory such as DRAM stores data on a capacitive element. Due to a charge leakage from the capacitive element, the memory cell must be periodically refreshed. The refresh process typically includes a step of performing a read operation to get a charge level in the original state, the charge level being stored in the memory cell.

As time elapses, different types of refresh methods have developed. According to an auto refresh method which is one of the refresh methods, a refresh timer exist outside a memory chip, and the memory chip performs a refresh operation in response to a periodic refresh command supplied by a controller.

According to a self-refresh method which is another of the refresh methods, a refresh timer exists in a memory chip, and all memory chips request a refresh start command from a controller.

SUMMARY

In an embodiment, a memory device may include an active controller configured to output a row active signal in response to a refresh control signal and a row enable signal, when an active signal is activated. The memory device may also include a refresh controller configured to generate and store a flag bit for controlling a refresh operation in response to a refresh signal, a precharge signal, and a precharge stop signal, and output the row enable signal corresponding to the stored flag bit to the active controller. The memory device may also include a cell array circuit configured to perform a refresh operation in memory cell array areas in response to the row active signal.

In an embodiment, a system may include a CPU (Central Processing Unit) configured to receive a program command and execute the corresponding program. The system may also include a MMU (Memory Management Unit) configured to convert a physical address and a command signal applied from the CPU, and including a program area indicating whether to execute a program. The system may also include a memory controller configured to output a control signal and an address in response to the physical address and the command signal applied from the MMU. The system may also include a memory device configured to perform a refresh operation in response to the control signal and the address applied from the memory controller, wherein the refresh operation is performed only in an area where a program is executed in response to the program area set in the MMU.

In an embodiment, a system may include a refresh controller configured to generate and store a flag bit for controlling a refresh operation in response to a refresh signal, a precharge signal, and a precharge stop signal, and output a row enable signal corresponding to the stored flag bit to an active controller. The system may also include a cell array circuit configured to perform a refresh operation in corresponding memory cell array areas in response to a row active signal, wherein the refresh operation is performed only in an area where a program is executed.

Wherein the refresh controller is configured to output the refresh control signal according to the refresh signal, the active signal, an address, the precharge signal, and the precharge stop signal.

Wherein the refresh controller is configured to generate a counting control signal and a refresh control signal according to the refresh signal.

Wherein the refresh controller is configured to output a counting signal to a selecting circuit according to a counting control signal.

A memory cell array configured to perform a read or write operation according to decoded signals of a row decoder and a column decoder.

A column decoder configured to select a column line of the memory cell array.

A row decoder configured to select a row line of the memory cell array.

A selecting circuit configured to select an output of an address latch circuit when a select signal is disabled.

Wherein when the precharge signal is enabled and the precharge stop signal is disabled, a flag signal is enabled.

Wherein when the precharge signal is disabled and the precharge stop signal is enabled, a flag signal is disabled.

Wherein a flag bit is "0" when the precharge signal is enabled, and "1" when the precharge signal is disabled.

A flag storage circuit configured to store flag bit information and output the row enable signal.

Wherein the flag storage circuit outputs the stored flag bit information on a memory area when the refresh signal is enabled.

Wherein the refresh controller is configured to count the refresh signal in response to a counting control signal.

Wherein the precharge signal is reset and reactivated to access a row area of the memory cell array.

A row decoder configured to perform a refresh operation in a corresponding memory area that is enabled.

DETAILED DESCRIPTION

Hereinafter, a memory device and a system including the same according to the present disclosure will be described below with reference to the accompanying figures through various embodiments. Various embodiments are directed to a memory device capable of reducing a refresh current by refreshing only an area in which a program is used in a memory, and a system including the same.

Figure 1:
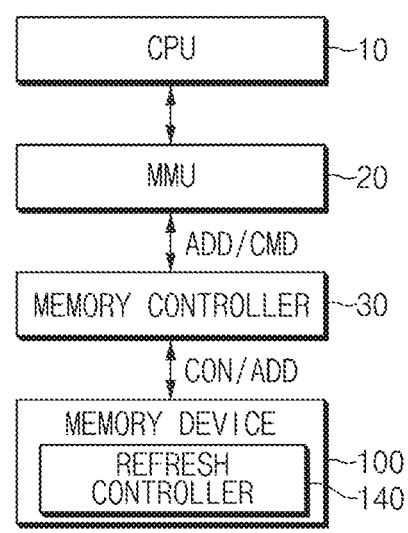
FIG. 1 is a configuration diagram of a system including a memory device according to an embodiment.

Referring to FIG. 1, a configuration diagram of a system including a memory device 100 according to an embodiment is described. The memory device 100 may be a circuit or the like.

The system according to an embodiment may include a CPU (Central Processing Unit) 10, an MMU (Memory Management Unit) 20, a memory controller 30, and a memory device 100.

The CPU 10 may receive a program command from a user and execute the program command. The CPU 10 may include a control unit, an arithmetic unit, a storage unit and the like.

The MMU 20 may serve to convert an address between an actual memory and a virtual memory. A system including an OS (Operating System) needs to perform an operation of dynamically generating a program to the memory device 100 or making the program disappear.

For this operation, the MMU 20 may process the addresses of a virtual memory area and a physical memory area. The MMU 20 may convert a physical address and a command signal, which are applied from the CPU 10. The MMU 20 may also output the converted address and signal to the memory controller 30.

The system may dynamically allocate a memory area when the program is generated through the MMU 20, and cancel the allocation of the memory area when the program disappears. Thus, when another program is executed, the MMU 20 may allocate a corresponding memory area. Through such a method, the system can manage the limited physical memory area more efficiently.

The memory controller 30 may output an address ADD and a control signal CON for controlling an operation of the memory device 100, in response to a physical address ADD and a command signal CMD applied from the MMU 20.

The memory device 100 may perform an active operation, a precharge operation, a refresh operation, a read operation, or a write operation, in response to the control signal CON and the address ADD applied from the memory controller 30. The memory device 100 may include a refresh controller 140 which will be described below.

Figure 2:
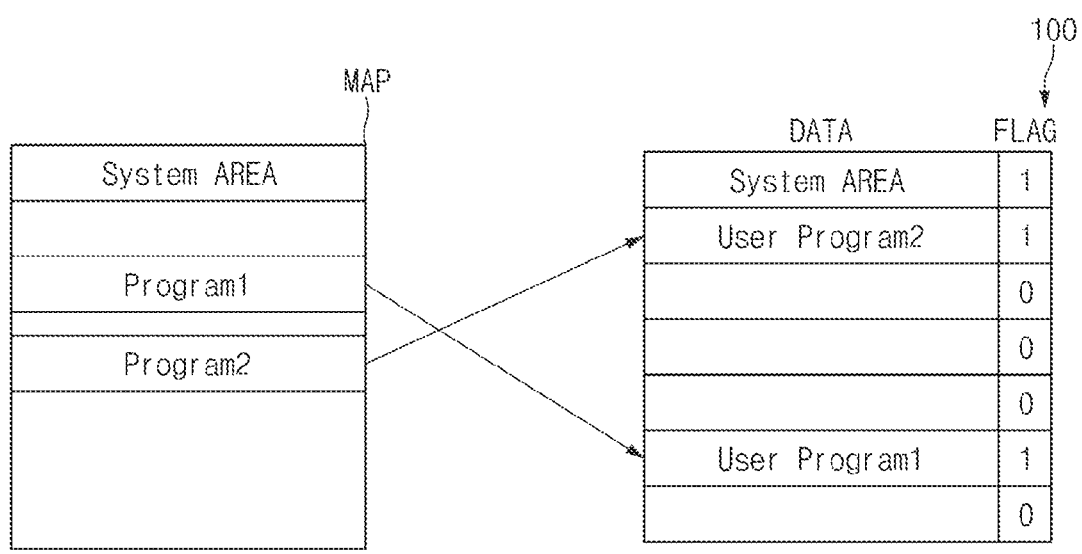
FIGS. 2 to 4 are diagrams for describing the operation of the system of FIG. 1.
Figure 3:
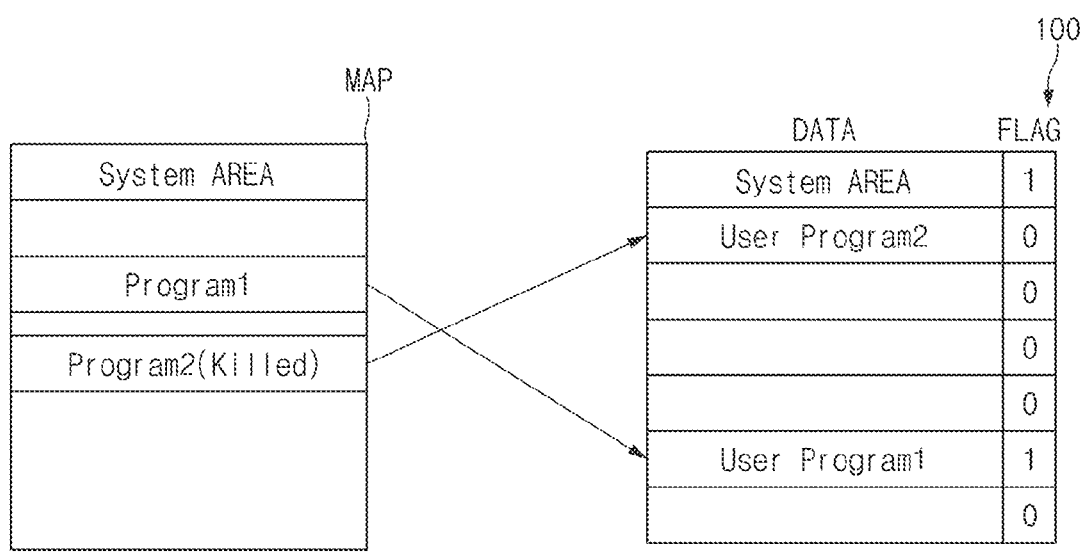
Figure 4:
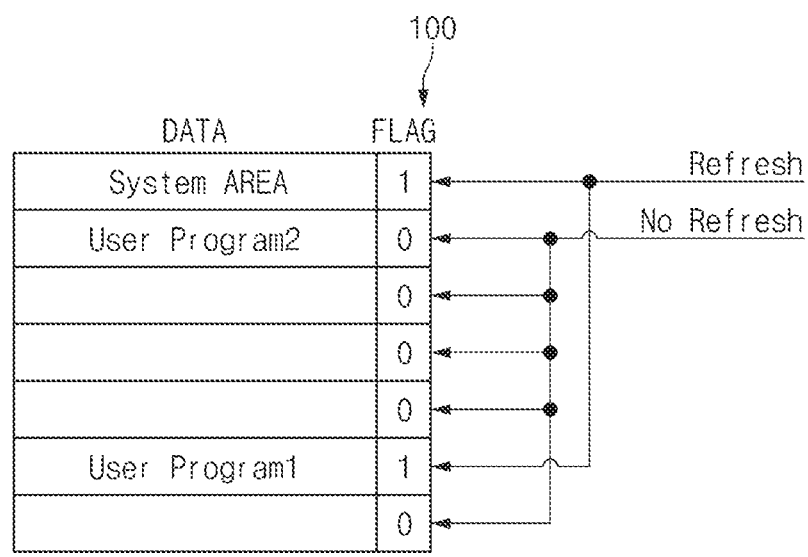

Referring to FIGS. 2 to 4, diagrams for describing the operation of the system of FIG. 1 are illustrated below.

For example, suppose that a system area and program areas 1 and 2 are allocated to a system memory map MAP. The system memory map MAP may be set in the MMU 20.

The memory device 100 may be divided into a data area DATA for storing program data and a flag area FLAG for storing flag data. The flag area FLAG may include a flag bit indicating whether the corresponding memory area of the data area DATA is allocated by the system or not.

The data area DATA may be divided into a system area and user program areas 1 and 2. The areas corresponding to the memory map MAP of the MMU 20 may be allocated to the memory device 100.

In the MMU 20, a separate area for managing the memory device 100 may be designated in the system area of the memory device 100. The user program areas 1 and 2 may be allocated to the other areas excluding the system area.

When programs allocated to the user program areas 1 and 2 of the memory device 100 are operated, a read or write operation for data required by the system may be performed in response to the control signal CON and the address ADD applied from the memory controller 30.

The user program 1 may be set in the data area DATA by the program 1 of the memory map MAP. The user program 2 may be set in the data area DATA by the program 2 of the memory map MAP.

The areas in which the programs 1 and 2 are used in the data area DATA need to be refreshed. However, the data area DATA may include an area enabled whenever a program is executed and an area disabled when no program is executed. Accordingly, except for the areas in which the programs 1 and 2 are executed in the data area DATA, no program may be executed in the other areas.

In FIG. 2, the flag data bit of a flag area FLAG corresponding to the area where no program is executed in the data area DATA may be set to "0". Furthermore, the flag data bit of a flag area FLAG corresponding to the area where the program is executed in the data area DATA may be set to "1".

Furthermore, the user program 1 may be set in the data area DATA by the program 1 of the memory map MAP. The area where the user program 1 is used in the data area DATA needs to be refreshed.

The system does not use all of the memory areas of the memory device 100. When the program 2 of the memory map MAP is killed, the user program 2 set in the data area DATA may be killed. Thus, this area does not need to be refreshed.

In FIG. 3, the flag data bit of the flag area FLAG corresponding to the area where the allocation of the user program 2 is canceled in the data area DATA may be changed to "0". More specifically, the flag data bit of the flag area FLAG may be disabled to "0" in response to the control signal CON and the address ADD applied to the memory controller 30 by the memory device 100.

When the flag bit is managed for each of the memory areas of the memory device 100, the memory device 100 may use the flag bit during a refresh operation.

FIG. 4 illustrates whether a refresh operation is performed in a state where the memory area storing the user program 2 of the memory device 100 is disabled.

In FIG. 4, an area of which the flag data bit is set to "1" among the flag areas FLAG of the memory device 100 may be refreshed. That is, since the flag data bits of the user program area 1 and the system area of the memory device 100 are set to "1", only the corresponding areas may be refreshed.

On the other hand, an area of which the flag data bit is set to "0" among the flag areas FLAG of the memory device 100 may not be refreshed. For example, suppose that the memory device 100 is implemented with DRAM. In this case, the system may apply 8K-bit refresh operation commands to the DRAM per 64 ms. Then, the DRAM may ignore a refresh operation command by referring to the flag data bit, such that the refresh operation is not performed.

The MMU 20 and the memory controller 30 may allocate a program to the memory device 100. Thus, the memory device 100 may not recognize the situation in which the data area DATA is enabled (program allocation) or disabled (program allocation cancellation).

At this time, a memory area in which program allocation is canceled in the data area DATA does not need to be refreshed because the memory area is an insignificant area.

Thus, in an embodiment, the memory device 100 may directly manage the data area DATA, and refresh only the area which is enabled on the data area DATA of the memory device 100. Thus, the system according to an embodiment can reduce refresh current consumption caused by an unnecessary refresh operation.

Figure 5:
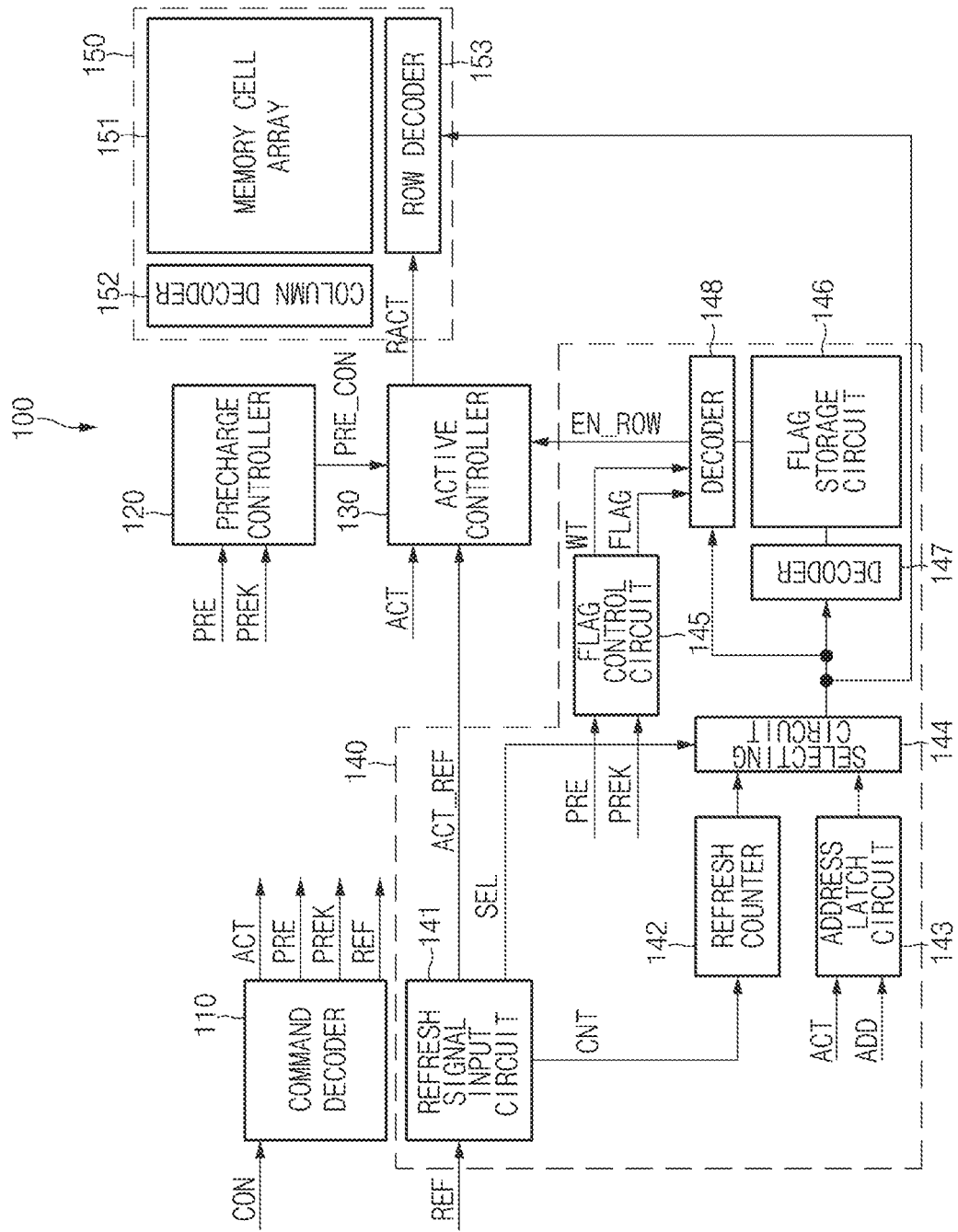
FIG. 5 is a configuration diagram of a memory device according to an embodiment.

Referring to FIG. 5, a configuration diagram of a memory device according to an embodiment is described.

The memory device 100 according to an embodiment may include a command decoder 110, a precharge controller 120, an active controller 130, a refresh controller 140, and a cell array circuit 150.

The refresh controller 140 may include a refresh signal input circuit 141, a refresh counter 142, an address latch circuit 143, a selecting circuit 144, a flag control circuit 145, a flag storage circuit 146, and decoders 147 and 148. The cell array circuit 150 may include a memory cell array 151, a column decoder 152, and a row decoder 153.

The command decoder 110 may decode a control signal CON applied from the memory controller 30. The command decoder 110 may also output an active signal ACT, a precharge signal PRE, a precharge stop signal PREK, and a refresh signal REF.

The precharge controller 120 may output a precharge control signal PRE_CON to the active controller 130 in response to the precharge signal PRE and the precharge stop signal PREK. The active controller 130 may output a row active signal RACT to the row decoder 153 in response to the precharge control signal PRE_CON, the active signal ACT, a refresh control signal ACT_REF, and a row enable signal EN_ROW.

The refresh controller 140 may output the row enable signal EN_ROW and the refresh control signal ACT_REF for controlling a refresh operation to the active controller 130 in response to the refresh signal REF, the active signal ACT, the address ADD, the precharge signal PRE, and the precharge stop signal PREK.

For this operation, the refresh signal input circuit 141 may generate a counting control signal CNT, a select signal SEL, and the refresh control signal ACT_REF in response to the refresh signal REF. The refresh counter 142 may output a counting signal to the selecting circuit 144 in response to the counting control signal CNT.

The address latch circuit 143 may latch the address ADD applied from the memory controller 30 and output the latched address ADD to the selecting circuit 144, when the active signal ACT is activated. The selecting circuit 144 may select any one of the output of the refresh counter 142 and the output of the address latch circuit 143 in response to the select signal SEL.

The flag control circuit 145 may output a write signal WT and a flag signal FLAG to the decoder 148 in response to the precharge signal PRE and the precharge stop signal PREK. The flag storage circuit 146 may store flag data in response to signals applied from the decoders 147 and 148. The flag storage circuit 146 may also output the stored flag data to the decoder 148.

The decoder 147 may decode an output of the selecting circuit 144 and output the decoded signal to the flag storage circuit 146. The decoder 148 may decode the data stored in the flag storage circuit 146. The decoder 148 may also output the row enable signal EN_ROW to the active controller 130.

The memory cell array 151 of the cell array circuit 150 may perform a data read or write operation in a selected cell in response to the decoded signals of the row decoder 153 and the column decoder 152. The column decoder 152 may select a column line of the memory cell array 151 in response to a column address. The row decoder 153 may select a row line of the memory cell array 151 in response to the output of the selecting circuit 144 and the row active signal RACT.

The operation of the memory device having the above-described configuration according to an embodiment will be described as follows.

First, when the active signal ACT is activated, the address latch circuit 143 may latch an address ADD. When the select signal SEL is deactivated, the selecting circuit 144 may select an output of the address latch circuit 143, and output the selected signal to the decoders 147 and 148 and the row decoder 153.

The decoder 147 may decode the output address of the selecting circuit 144 and allocate the decoded address to the corresponding area of the flag storage circuit 146. The flag control circuit 145 may output the write signal WT and the flag signal FLAG to the decoder 148 in response to the precharge signal PRE and the precharge stop signal PREK.

For example, when the precharge signal PRE is at a high level and the precharge stop signal PREK is at a low level, the flag signal FLAG may become a high level. In addition, a flag bit of "1" may be stored in the flag storage circuit 146. On the other hand, when the precharge signal PRE is at a low level and the precharge stop signal PREK is at a high level, the flag signal FLAG may become a low level, and a flag bit of "0" may be stored in the flag storage circuit 146.

In an embodiment, the case in which the flag bit is set to "1" when the precharge signal PRE is at a high level and set to "0" when the precharge signal PRE is at a low level was taken as an example for description. However, the present embodiment is not limited thereto. The flag bit may be set to "0" when the precharge signal PRE is at a high level, and set to "1" when the precharge signal PRE is at a low level.

The flag signal FLAG decoded by the decoder 148 may be stored as a flag bit in the corresponding address area of the flag storage circuit 146. In the initial state, the flag bit of the flag signal FLAG may be set to "0". Thus, the flag bit of "0" may be stored in the flag storage circuit 146.

When the flag bit stored in the flag storage circuit 146 is "0", the row enable signal EN_ROW may become a low level. The active controller 130 may deactivate the row active signal RACT when the row enable signal EN_ROW has a low level.

When the row enable signal EN_ROW has a low level, it may indicate that the corresponding memory area of the memory device 100 is disabled. Then, the row decoder 153 may be disabled, and no refresh operation may be performed on the corresponding area.

When the refresh signal REF is activated, the refresh signal input circuit 141 may activate the counting control signal CNT, the select signal SEL, and the refresh control signal ACT_REF. Then, the refresh counter 142 may count a refresh signal in response to the counting control signal CNT. The refresh counter 142 may also output a counting signal to the selecting circuit 144.

When the select signal SEL is activated, the selecting circuit 144 may select the counting signal of the refresh counter 142, and output the selected signal to the decoders 147 and 148 and the row decoder 153. The decoder 147 may decode the counting signal of the refresh counter 142, and output the decoded signal to the flag storage circuit 146.

The flag bit information stored in the flag storage circuit 146 may be outputted as the row enable signal EN_ROW through the decoder 148. When the refresh signal REF is activated, the flag storage circuit 146 may output flag bit information on a memory area which is to be refreshed as the row enable signal EN_ROW.

The active controller 130 may activate the row active signal RACT in response to the row enable signal EN_ROW, when the active signal ACT, the refresh control signal ACT_REF, and the precharge control signal PRE_CON are activated. The precharge control signal PRE_CON may be used to activate the active controller 130.

At this time, when the precharge signal PRE is at a high level and the precharge stop signal PREK is at a low level, the precharge controller 120 may activate and output the precharge control signal PRE_CON.

Then, the row decoder 153 may be enabled by the row active signal RACT. Thus, a refresh operation may be performed on the corresponding cells of the memory cell array 151.

When the precharge signal PRE is at a high level and the precharge stop signal PREK is at a low level, the flag signal FLAG may become a high level. Further, a flag bit of "1" may be stored in the flag storage circuit 146. When the flag bit stored in the flag storage circuit 146 is "1", the row enable signal EN_ROW may become a high level.

The active controller 130 may activate the row active signal RACT when the row enable signal EN_ROW is at a high level. When the row enable signal EN_ROW is at a high level, it may indicate that the corresponding memory area of the memory device 100 is enabled. Then, the row decoder 153 may be enabled to perform a refresh operation on the corresponding area.

The precharge signal PRE may be activated to enable the disabled area of the memory device 100. In order to access another row area in the memory cell array 151, the precharge signal PRE may be controlled to be reset and reactivated.

At this time, the information on whether the corresponding row line is an enabled row line or disabled row line may be known from the address ADD applied from the memory controller 30.

Figure 6:
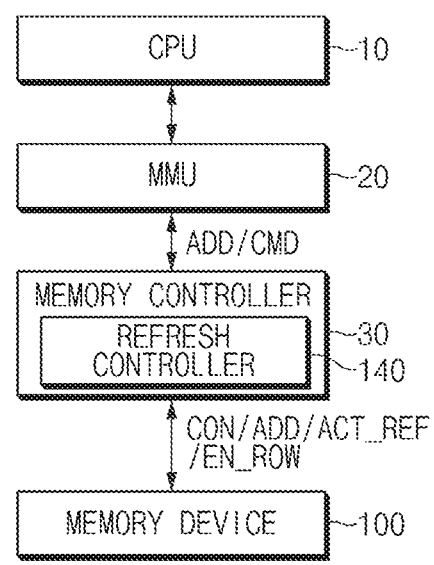
FIG. 6 is a configuration diagram of a system including a memory device according to an embodiment.

Referring to FIG. 6, a configuration diagram of a system including a memory device according to an embodiment is described.

The system according to the embodiment of FIG. 6 may include a CPU 10, an MMU 20, a memory controller 30, and a memory device 100.

The memory controller 30 may output an address ADD and a control signal CON for controlling an operation of the memory device 100, in response to a physical address ADD and a command signal CMD which are applied from the MMU 20.

The memory device 100 may perform an active operation, a precharge operation, a refresh operation, a read operation, or a write operation, in response to a control signal CON and an address ADD which are applied from the memory controller 30.

FIG. 6 illustrates that the refresh controller 140 of FIG. 5 is included in the memory controller 30.

At this time, the command signal CMD applied to the memory controller 30 from the MMU 20 may include a refresh signal REF, an active signal ACT, a precharge signal PRE, and a precharge stop signal PREK. The control signal CON applied to the memory device 100 from the memory controller 30 may include a refresh control signal ACT_REF, a row enable signal EN_ROW, and an output signal of the selecting circuit 144.

In an embodiment, the case in which the configuration of the refresh controller 140 is included in the memory device 100 or the memory controller 30 has been taken as an example for description. However, the present embodiment is not limited thereto, but the configuration of the refresh controller 140 may be included in the MMU 20 or separately positioned outside the MMU 20, the memory controller 30, and the memory device 100.

According to embodiments, the memory device and the system can reduce a refresh current by refreshing only an area in which a program is used in the memory.

While certain embodiments have been described above, it will be understood to those skilled in the art that the embodiments described are by way of examples only. Accordingly, the memory device and system described herein should not be limited based on the described embodiments. Rather, the memory device and system described herein should only be limited in light of the claims that follow when taken in conjunction with the above description and accompanying figures.

What is claimed is:

1. A system comprising:
   a CPU (Central Processing Unit) configured to receive a program command and execute the corresponding program;
   a MMU (Memory Management Unit) configured to convert a physical address and a command signal applied from the CPU, and comprising a program area indicating whether to execute a program;
   a memory controller configured to output a control signal and an address in response to the physical address and the command signal applied from the MMU; and
   a memory device configured to perform a refresh operation in response to the control signal and the address applied from the memory controller, wherein the refresh operation is performed in at least one or more area where a program is executed in response to the program area set in the MMU,
   wherein the memory device comprises:
   an active controller configured to output a row active signal in response to a refresh control signal and a row enable signal, when an active signal is activated;
   a refresh controller configured to generate and store a flag bit for controlling a refresh operation in response to a refresh signal, a precharge signal, and a precharge stop signal, and output the row enable signal corresponding to the stored flag bit to the active controller; and
   a cell array circuit configured to perform a refresh operation in each corresponding memory cell array area in response to the row active signal.

2. The system of claim 1, wherein the memory device is divided into a data area for storing program data and a flag area for storing flag data indicating whether to execute the program.

3. The system of claim 2, wherein among the flag areas of the memory device, the flag bit of an area where no program is executed is set to "0", and the flag bit of an area where the program is executed is set to "1".

4. The system of claim 3, wherein the memory device changes the flag bit of an area, in which allocation of the program is canceled in the data area, from "1" to "0", in response to the control signal and the address applied from the memory controller.

5. The system of claim 3, wherein the memory device sets the flag bit for memory areas, and performs a refresh operation on each of the memory areas in response to the flag bit.

6. The system of claim 1, wherein the memory device further comprises:

a command decoder configured to decode a control signal applied from an outside source and output the active signal, the precharge signal, the precharge stop signal, and the refresh signal; and a precharge controller configured to output a precharge control signal to the active controller in response to the precharge signal and the precharge stop signal.

7. The system of claim 1, wherein when the flag bit is "0", the row enable signal becomes a low level such that a refresh operation is not performed on the corresponding memory area of the cell array circuit, and when the flag bit is "1", the row enable signal becomes a high level such that the refresh operation is performed on the corresponding memory area of the cell array circuit.

8. The system of claim 1, wherein the refresh controller comprises:

a refresh signal input circuit configured to generate a counting control signal, a select signal, and the refresh control signal in response to the refresh signal;

a refresh counter configured to output a counting signal in response to the counting control signal;

an address latch circuit configured to latch an address which is inputted when the active signal is activated;

a selecting circuit configured to select any one of an output of the refresh counter and an output of the address latch circuit in response to the select signal; and a flag storage circuit configured to store the flag bit in a corresponding address area in response to an output of the selecting circuit.

9. The system of claim 8, wherein the refresh controller further comprises:

a first decoder configured to decode the output of the selecting circuit and output the decoded signal to the flag storage circuit;

a second decoder configured to decode the flag bit stored in the flag storage circuit and output the row enable signal; and a flag control circuit configured to generate a write signal and a flag signal for storing the flag bit in the flag storage circuit in response to the precharge signal and the precharge stop signal.

* * * * *